United States Patent
Ho et al.

(10) Patent No.: US 6,486,070 B1
(45) Date of Patent: Nov. 26, 2002

(54) ULTRA-HIGH OXIDE TO PHOTORESIST SELECTIVE ETCH OF HIGH-ASPECT-RATIO OPENINGS IN A LOW-PRESSURE, HIGH-DENSITY PLASMA

(75) Inventors: Chok W. Ho, Milpitas, CA (US); Fang-Ju Lin, Tainan (TW); Chuan-Kai Lo, Hsin-chu (TW)

(73) Assignee: Lam Research Corporation, Fremont, CA (US)

( * ) Notice: Subject to any disclaimer, the term of this patent is extended or adjusted under 35 U.S.C. 154(b) by 103 days.

(21) Appl. No.: 09/666,762

(22) Filed: Sep. 21, 2000

(51) Int. Cl.[7] ............................................. H01L 21/302
(52) U.S. Cl. ..................... 438/706; 438/710; 438/712; 438/714
(58) Field of Search ................. 438/706, 710, 438/712, 714, 637, 638, 639; 156/345, 345.61

(56) References Cited

U.S. PATENT DOCUMENTS

| | | | | |
|---|---|---|---|---|
| 5,382,311 A | * | 1/1995 | Ishikawa et al. | 156/345 |
| 5,397,431 A | * | 3/1995 | Kadomura | 156/345 |
| 5,595,627 A | * | 1/1997 | Inazawa et al. | 156/345 |
| 5,843,847 A | * | 12/1998 | Pu et al. | 438/723 |
| 5,877,032 A | * | 3/1999 | Guinn et al. | 438/9 |
| 5,910,453 A | * | 6/1999 | Gupta et al. | 438/717 |
| 6,083,844 A | | 7/2000 | Bui-Le et al. | 438/720 |

* cited by examiner

*Primary Examiner*—Benjamin L. Utech
*Assistant Examiner*—Lan Vinh
(74) *Attorney, Agent, or Firm*—Beyer Weaver & Thomas, LLP

(57) ABSTRACT

An etch that provides a high oxide to photoresist selectivity in a low-pressure, high-density plasma is provided. An extremely high reverse RIE lag is achieved, wherein the etching of small high-aspect ratio openings is possible, but that of large openings is not. A high-density plasma is generated so that carbon monoxide (CO) is ionized to $CO^+$ so that at least 1 sccm equivalent of $CO^+$ is provided. Excited CO neutrals ($CO^*$) are also present within the plasma. Fluorocarbon and hydrofluorocarbon gases are also provided. The excited CO neutrals scavenge free fluorine, near the wafer surface and in the large openings, increasing polymer deposition on the photoresist and in the large openings thus reduce or stop etching in those regions. Concurrently, $CO^+$ is not hindered by diffusion limitation and is readily accelerated deep into the small openings by an applied electric potential; hence, providing oxygen atoms near the bottom of the small openings which help to remove polymer at the etch front and eliminates the propensity for etch stop.

15 Claims, 4 Drawing Sheets

ULTRA-HIGH OXIDE TO PHOTORESIST SELECTIVE ETCH OF HIGH-ASPECT-RATIO OPENINGS IN A LOW-PRESSURE, HIGH-DENSITY PLASMA

BACKGROUND OF THE INVENTION

The present invention relates to plasma etching. More particularly, the present invention relates to plasma etching of an oxide layer to form high-aspect ratio (HAR) openings.

The use of a device to generate a plasma in a vacuum chamber to etch an oxide layer on a substrate is known. In such oxide etches, a fluorine containing gas may be used to increase etching rate an a carbon monoxide (CO) is used to scavenge fluorine to facilitate discussion, FIG. 1 is a schematic view of part of a wafer 100 with a photoresist mask 102, over a silicon oxide layer 104, over a substrate 106. With reference to figures herein, it should be noted that other additional layers above, below, or between the layers shown may be present. Further, not all of the shown layers need necessarily be present and some or all may be substituted by other different layers. The wafer 100 may be placed in a plasma processing chamber where a medium density plasma at a pressure of greater than 100 milliTorr (mTorr) comprising a fluorine containing gas would be used to etch parts of the oxide layer 104 exposed by the photoresist mask 102. Sometimes CO is added. CO is excited in the plasma and reacts with free Fluorine to form $COF_x$, thus reducing both oxide and photoresist etch rates. Generally the medium density plasma might have a CO flow rate of less than 200 sccm. Fluorine in the medium density plasma would increase not only the oxide etch rate, but will also increase the photoresist etch rate, which will increase the critical dimension (CD) of the openings. A polymer providing gas or carbon monoxide (CO) may be added to increase oxide to photoresist selectivity, but may also deposit within the openings causing etch stop, thus limiting the depth of the openings. Therefore, in the prior art, too much fluorine would reduce oxide to photoresist selectivity and too much CO or polymer providing gas would cause excessive fluorocarbon deposition and result in etch stop.

In addition, oxide etching processes may etch larger openings faster than smaller openings because of an effect called RIE Lag. This usually causes the smaller, higher aspect ratio, openings to etch more slowly than the larger, lower aspect ratio, openings.

It was believed a flow rate of CO above 200 sccm would cause reverse RIE Lag which was believed should be avoided. It was believed that a high flow rate of CO would cause etch stop, which would limit the depth of the openings.

In view of the foregoing, it is desirable to provide an oxide etching process with high oxide to photoresist selectivity without causing etch stop and CD enlargement.

SUMMARY OF THE INVENTION

To achieve the foregoing and other objects and in accordance with the purpose of the present invention, a plasma etch of a layer of a wafer is performed in a low-pressure, high-density, inductively-coupled plasma. A wafer is placed in a processing chamber. A source gas, comprising a fluorine containing gas and carbon monoxide, is flowed into the processing chamber. A plasma is ignited. More than about 0.5% of the carbon monoxide is ionized into $CO^+$ along with excitation of the some of the remaining CO ($CO^*$). The $CO^+$ remains in the neutral phase. The $CO^*$ reacts with free Fluorine to form $COF_x$ while the $CO^+$ contributes oxygen to the etch front and reduces the polymer layer thickness at the etch front. The layer is then etched.

The invention also provides a processing chamber for etching a layer of a wafer. A chamber top with a chamber wall extending from the chamber top to form a cavity is provided. A chuck supports the wafer within the cavity. A gas source provides a fluorine containing gas and carbon monoxide into the processing chamber. An exhaust device is able to maintain pressure in the processing chamber below 40 mTorr. A plasma ignition device is able to ionize more than about 0.5% of the carbon monoxide into $CO^+$.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
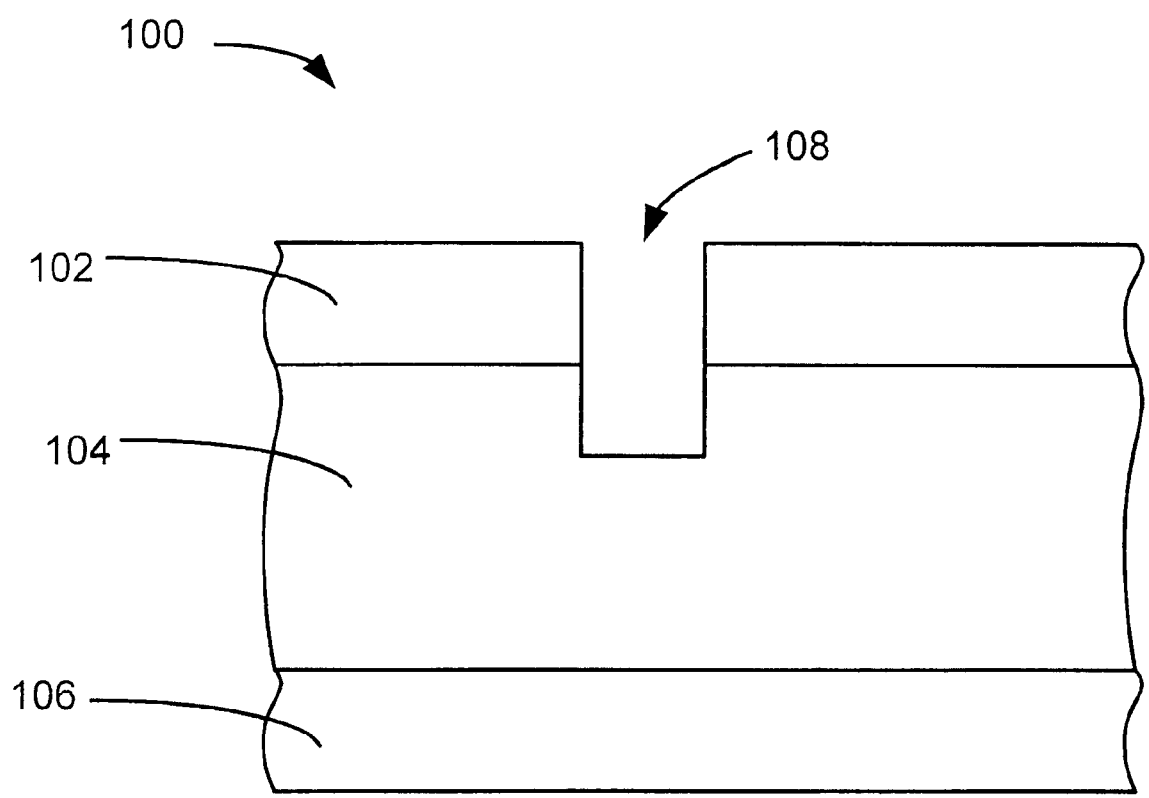
FIG. 1 is a schematic view of part of a wafer etched in the prior art.
Figure 2:
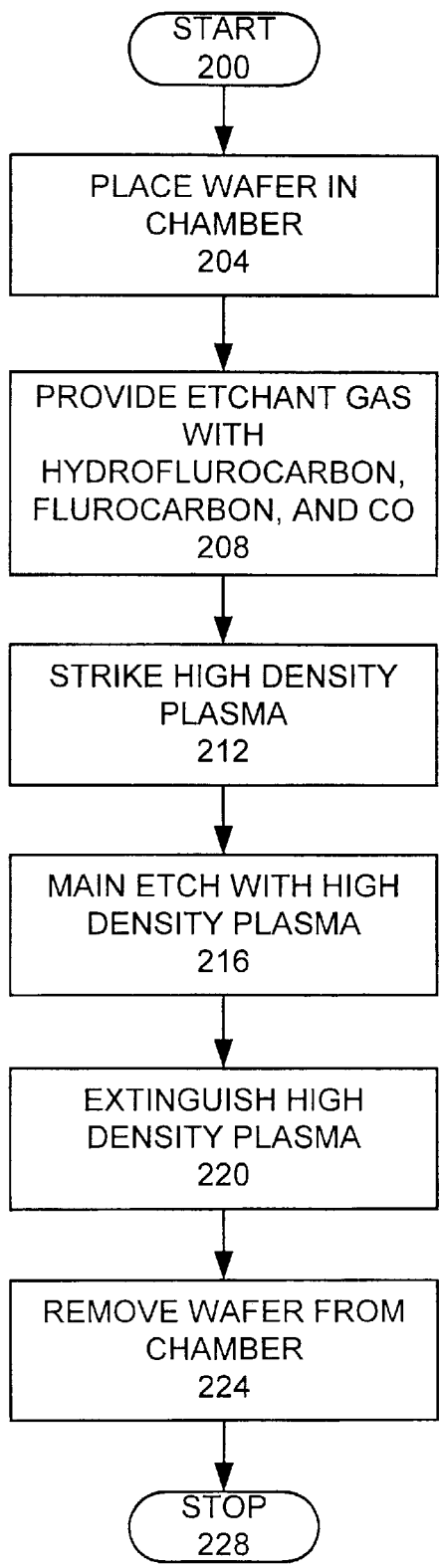
FIG. 2 is a flow chart of a process that may be used in an embodiment of the invention.
Figure 3:
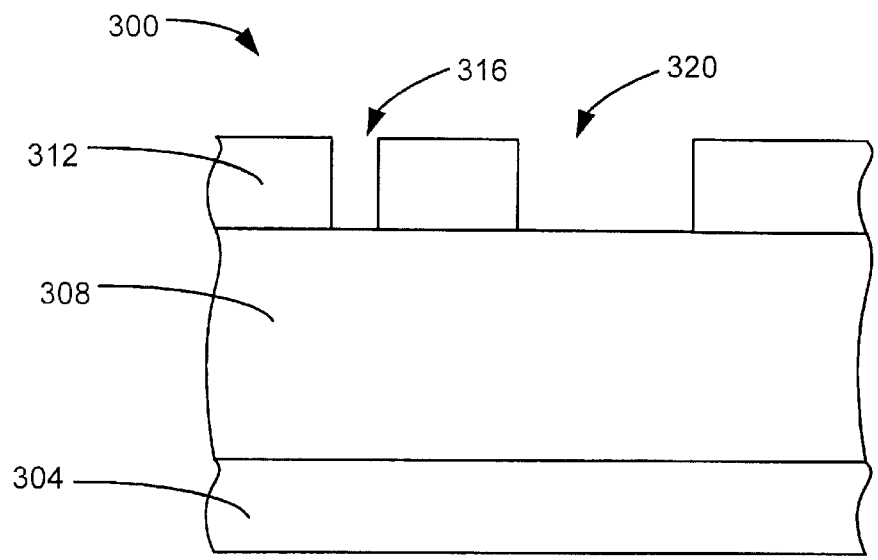
FIG. 3 is a schematic cross sectional view of a wafer before etching by the preferred embodiment of the invention.
Figure 4:
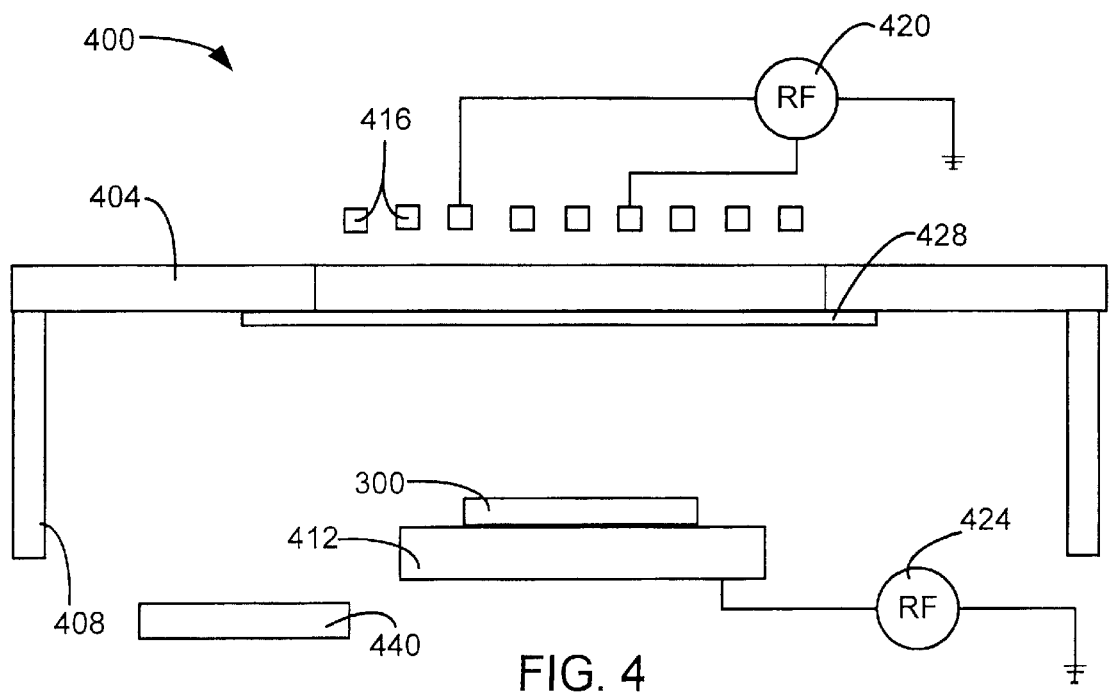
FIG. 4 is a schematic view of a plasma processing chamber, which may be used by the preferred embodiment of the invention.

To facilitate discussion, FIG. 2 is a flow chart of a process that may be used in an embodiment of the invention. According the flow chart, a wafer is placed in a plasma processing chamber (step 204). FIG. 3 is a schematic cross sectional view of a wafer 300, comprising a substrate 304, an oxide layer 308, and a photoresist mask 312. The photoresist mask 312 has a plurality of apertures to allow the forming of openings in the oxide layer 308. In this example, the photoresist mask has a narrow aperture 316 and a wide aperture 320. Preferably, the narrow aperture 316 has a diameter less than 0.4 microns. The wide aperture may have a diameter much greater than 0.4 microns, and may be used to define an open space. FIG. 4 is a schematic view of a plasma processing chamber 404, which may be used by a preferred embodiment of the invention. The plasma chamber 400 may comprise a chamber top 404, with chamber walls 408 extending from the chamber top 404. A ceramic liner may be used to form part of the chamber walls 408. A chuck 412 may be positioned below the chamber top 404 to hold a substrate within the chamber cavity. An inductive coil 416 connected to a first power source 420, such as a radio frequency power source, is placed above the plasma chamber 400. In other embodiments other plasma ignition or heating devices may be used in place of the inductive coil 416 and the first power source 420. A second power source 424, such as a second radio frequency power source, may be connected to the chuck 412. A gas distribution plate 428 may be used to provide gas to the interior cavity of the plasma chamber 400. When the wafer 300 is placed in the chamber 400, the wafer 300 is placed on the chuck 412. The chuck 412 may be an electrostatic chuck or may use mechanical force or some other method for holding the wafer 300 on the chuck 412. A pump 440 may be located next to an exhaust port. An example of a plasma processing chamber 404, which may be used to practice the invention is a LAM TCP9100.

An etchant gas comprising CO and fluorine containing gases is then provided into the plasma chamber 400 through the gas distribution plate 428 to allow a gas flow stabilization (step 208). An example of an etchant gas may be $CH_2F_2$, $C_4F_8$, and CO. Table I provides preferred ranges for the flow of etchant gas.

TABLE I

| PARAMETERS | BROAD RANGE | PREFERRED RANGE | MORE PREFERRED RANGE |
|---|---|---|---|
| PRESSURE (mTorr) | 0–40 | 10–30 | 15–25 |
| Flow rate of $CH_2F_2$ (sccm) | 10–60 | 20–50 | 30–40 |
| Flow rate of $C_4F_8$ (sccm) | 10–60 | 20–40 | 25–35 |
| Flow rate of CO (sccm) | >250 | >300 | 340–500 |

The pump 440 may be used to keep the pressure in the plasma chamber 400 below 40 mTorr.

The etchant gas is energized to strike a plasma (step 212). This may be achieved by providing power from the first power source 420 to the inductive coil. An example of such powers are broadly 300–700 watts, more preferably 400–600 watts, most preferably 450–550 watts from the first power source 420. The flow of gas and pressure may be maintained within the same ranges as the previous step. Other power ranges may be used as long as the etchant gas is ignited to form a plasma.

A main etch with a resulting high density plasma is then performed (step 216). The pressure may be decreased and the power from either the first power source 420 or the second power source 424 may be increased. Table II provides preferred ranges for the pressure and power.

TABLE II

| PARAMETERS | BROAD RANGE | PREFERRED RANGE | MORE PREFERRED RANGE |
|---|---|---|---|
| Pressure (mTorr) | <40 | <30 | <20 |
| Power from First Power Source (Watts) | 800–2400 | 1200–2000 | 1400–1800 |
| Power from Second Power Source (Watts) | 600–1800 | 800–1600 | 1000–1400 |

Figure 5:
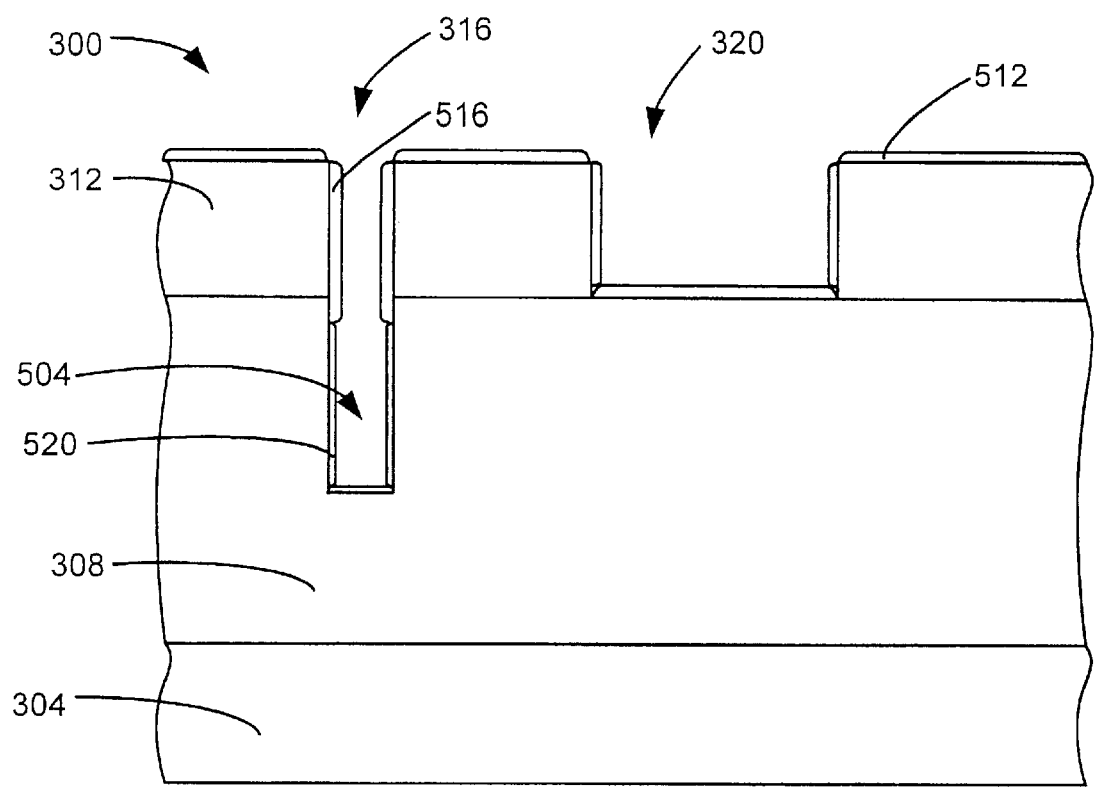
FIG. 5 is an enlarged schematic view of part of the wafer undergoing etching by the preferred embodiment of the invention.

During the main etch at least 0.5% of the carbon monoxide (CO) is in the ionized form of $CO^+$. More preferably, at least 1.0% of the carbon monoxide is in the ionized form of $CO^+$. During this process, parts of the oxide layer are etched away. FIG. 5 is an enlarged schematic view of part of the wafer 300 undergoing etching. Under the narrow aperture 316 in the photoresist mask 312 a small opening 504 is being etched faster than a large opening under the wide aperture 320 in the photoresist mask. The etching of the small opening 504 may be so much faster than the etching of the large opening, that the etching of the large opening may be negligible, and therefore is not shown in FIG. 5.

While not wishing to be bound by theory, it is believed that polymer forms on the exposed surfaces of the wafer 300. Polymer 512 forms on the top of the photoresist mask 312, the side-walls of the wide aperture 320, and the bottom of the large opening. The polymer 512 may be a fluorocarbon material. A polymer 516 may also form side-walls on the narrow aperture 316 of the photoresist mask 312 and the upper portion of the small opening 504. The polymer 516 may be a fluorocarbon material. A polymer 526 may also form on the side-walls of the lower part of the small opening 504 and the bottom of the small opening 504. The polymer 520 may be a fluorocarbon material. It is believed that the polymer 520 on the lower part and bottom of the small opening 504 is thinner than the polymer 516 on the upper portion of the narrow trench 504 or the narrow aperture 316 and the polymer 512 on the top of the photoresist mask 312 and in the broad opening. This may be caused by the fact that since the narrow trench 504 is so narrow, less polymer is able to make it to near the bottom of the narrow trench. Although the difference of thickness within the narrow trench 504 may be gradually tapered, two polymer thickness are shown for clarity. It is also believed that polymer 520 on the lower part and bottom of the small opening 504 has a higher carbon to fluorine ratio than the polymer 520 on the upper portion of the small opening 504 or the narrow aperture 316 and the polymer 512 on the top of the photoresist mask 312 and in the large opening. This may be caused by the energy loss due to collision of the polymer precursor with the side-wall and subsequent polymer deposition on the side-wall before reaching the bottom of the small opening 504.

It is believed that in the prior art, the higher concentration of carbon in the polymer 520 near the bottom of the small opening 504 and the lack of an oxygen source, e.g. $CO^+$, reaching the bottom of the small opening 504 may cause the small opening 504 to etch stop at high CO flows.

In the present invention, the low pressure and high power from the first power source 420 provide the high density plasma. A high power from the second power source 424 provides high ion energy. The presence of free fluorine increases etching rate.

Since the invention provides a high density plasma, more than 0.5% of the CO in the source gas is ionized to $CO^+$. More preferably greater than 1% of the CO in the source gas is ionized to $CO^+$. Ionization of 0.5% of the CO with a flow rate of CO being greater than 250 sccm, would result in at least a 1.25 sccm equivalent $CO^+$. Preferably a 1 sccm equivalent of $CO^+$ is provided. To provide 0.5% $CO^+$ would require at least some of the CO to be excited to ($CO^*$). The electric field from the second power source 424 and the chuck 412, draws the $CO^+$ towards the bottom of the small opening 504. It is believed that the high energy $CO^+$ may lose the carbon atom by collision with the side-wall to provide an oxygen ion. The oxygen ion with energy transferred by $Ar^+$ from the electric field is better able to interact with the carbon-rich polymer 520 near the bottom of the small opening 504 and forms a volatile product causing some of the carbon-rich polymer 520 to be removed. The higher concentration of carbon monoxide in the high density plasma also allows more free fluorine to be scavenged to form $COF_x$. The scavenging of the free fluorine enhances the deposition of the polymer 516 on the upper portion of the small opening 504, the narrow aperture 316, the polymer 512 on the top of the photoresist mask 312 and in the large opening, causing a slowing of the etching or etch stop of the photoresist mask and large opening. Since there is a lack of polymer deposition inside the smaller opening 504, the propensity for etch stop is reduced and the oxide to photoresist etch selectivity is improved in the small opening 504. Reverse RIE lag is provided between the small opening 504 and the large opening.

It is also believed that high density plasmas provide for a wider change in ion to neutral ratio than would be achievable in a medium density plasma, thus allowing for a wider change in the effective sticking coefficient of the polymer precursors. Increasing the effective sticking coefficient of polymer precursor causes more polymer to adhere to the top of the smaller opening 504 and aperture 316, so that the polymer 520 layer near the bottom of the small opening is even thinner. The inventive method allows a photoresist to oxide etch selectivity of greater than 10 to be achieved in a high density plasma.

Since etch stop of the small opening is reduced, a deep high aspect ratio small opening is more easily formed. The small opening may be less than 0.4 microns in diameter. More preferably the small opening is less than 0.35 microns in diameter. The aspect ratio (height vs. width of the small openings) may be greater than 10. The openings may have a rectangular, round or oval cross-section. Such small openings may be useful for forming electrical contacts and vias.

The unique parameters specified above provide for extremely high reverse RIE lag, which allows the etching of small high aspect ratio openings without etch stop and with a photoresist to oxide selectivity greater than 10 in a low-pressure, high-density plasma.

While this invention has been described in terms of several preferred embodiments, there are alterations, permutations, and substitute equivalents which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A method of providing a plasma etch of a layer of a wafer, comprising:

placing the wafer in a processing chamber;

flowing a source gas, comprising a fluorine containing gas and carbon monoxide, into the processing chamber;

igniting a plasma;

ionizing more than about 0.5% of the carbon monoxide into $CO^+$;

creating an electric potential which accelerates $CO^+$ to the wafer during etching the layer; and etching the layer.

2. The method, as recited in claim 1, wherein the $CO^+$ contributes oxygen to the etch front during the etching the layer.

3. The method, as recited in claim 2, further comprising creating excited carbon monoxide, wherein the excited carbon monoxide reacts with free fluorine to form $COF_x$.

4. The method, as recited in claim 1, wherein the creating an electric potential, comprises:

placing the wafer on a chuck;

connecting a power source to the chuck; and applying a voltage to the chuck.

5. The method, as recited in claim 4, wherein the applying a voltage to the chuck, applies an alternating voltage to the chuck.

6. The method, as recited in claim 5, wherein the alternating voltage alternates at a radio frequency.

7. The method, as recited in claim 1, wherein the ionizing more than about 0.5% of the carbon monoxide into $CO^+$, provides more than 1 sccm equivalent of $CO^+$ in the processing chamber.

8. The method, as recited in claim 7, further comprising maintaining the pressure in the processing chamber at less than 40 mTorr during the etching the layer.

9. The method, as recited in claim 8, wherein the flowing of a source gas, flows more than 250 sccm of CO into the processing chamber.

10. The method, as recited in claim 8, wherein the flowing of a source gas, flows more than 300 sccm of CO into the processing chamber.

11. The method, as recited in claim 8, wherein the flowing of a source gas, flows between about 340–500 sccm of CO into the processing chamber.

12. The method, as recited in claim 11, wherein the source gas further comprises a polymer source.

13. The method, as recited in claim 12, wherein the wafer has an oxide layer and a photoresist mask over the oxide layer, wherein the photoresist mask has at least one aperture with a diameter less than 0.4 microns.

14. The method, as recited in claim 8, wherein the source gas further comprises a polymer source.

15. A method of providing a plasma etch of a layer of a wafer, comprising:

placing the wafer in a processing chamber;

flowing a source gas, comprising a fluorine containing gas and carbon monoxide, into the processing chamber;

igniting a plasma;

ionizing more than about 0.5% of the carbon monoxide into $CO^+$;

creating an electric potential which accelerates $CO^+$ to the wafer during etching the layer; and etching the layer using the $CO^+$ during the etching.

* * * * *